United States Patent [19]
Hang

[11] Patent Number: 5,644,268
[45] Date of Patent: Jul. 1, 1997

[54] FEED FORWARD RF AMPLIFIER FOR COMBINED SIGNAL AND ERROR AMPLIFICATION

[75] Inventor: Huong M. Hang, San Jose, Calif.

[73] Assignee: Spectrian, Inc., Mountain View, Calif.

[21] Appl. No.: 412,479

[22] Filed: Mar. 28, 1995

Related U.S. Application Data

[63] Continuation-in-part of Ser. No. 369,546, Jan. 6, 1995, Pat. No. 5,528,196.

[51] Int. Cl.[6] .................................................. H03F 1/32
[52] U.S. Cl. .................................................. 330/151; 330/52
[58] Field of Search ............................... 330/52, 149, 151

[56] References Cited

U.S. PATENT DOCUMENTS

| | | |
|---|---|---|
| 4,629,996 | 12/1986 | Watanabe et al. ............... 330/151 |
| 5,130,663 | 7/1992 | Tattersall, Jr. . |
| 5,157,345 | 10/1992 | Kenington et al. ............... 330/149 |
| 5,334,946 | 8/1994 | Kenington et al. ............... 330/144 |

OTHER PUBLICATIONS

Kenington, et al., RF Linear Amplifier Design, Centre for Communications Research, University of Bristol, United Kingdom, undated (after Jun. 1993 reference), pp. 1–10.
Brochure of Centre for Communications Research, Narrowband Amplifier Design, University of Bristol, United Kingdom, undated.
Brochure of British Technology Group Ltd., Broadband Linear Power Amplifier, London, United Kingdom, undated, 2 pages.

*Primary Examiner*—James B. Mullins
*Attorney, Agent, or Firm*—Townsend and Townsend and Crew LLP; Henry K. Woodward

[57] ABSTRACT

To reduce the size and power dissipation of a feed-forward amplifier, two identical high power amplifiers in a quadrature combined configuration function both as the main amplifier and as the error amplifier. The feed-forward amplifier has two control loops to increase amplifier linearity and reduce intermodulation distortion. A first loop is provided to subtract a properly scaled and delayed sample of the amplifier input spectrum from a scaled and phase shifted sample of its output spectrum which contains intermodulation distortion. The result of this subtraction (if the samples are maintained at the same amplitude and 180 degrees out of phase) is a signal rich in the intermodulation products of the amplifier. A differential phase-amplitude comparator which compares the signals prior to and after amplification and generates control signals for amplitude and phase trimmers for the signal prior to the amplifier and thus maintains the required equal amplitude and 180 degree phase relationship required for carrier cancellation. A second loop is provided to reduce distortion of the error signal due to effects of the amplifier.

6 Claims, 2 Drawing Sheets

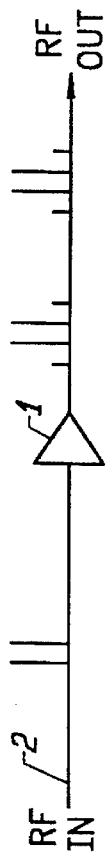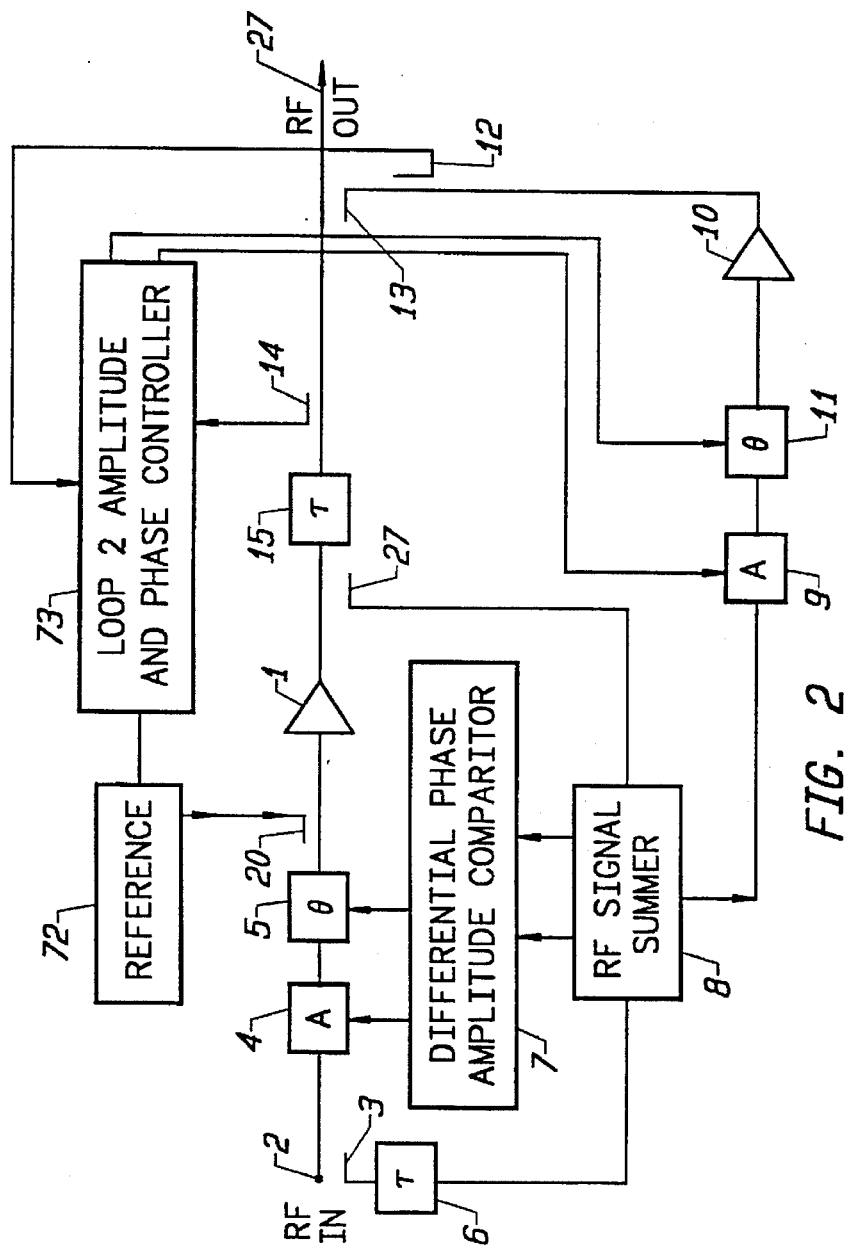
FIG. 1
FIG. 2

FEED FORWARD RF AMPLIFIER FOR COMBINED SIGNAL AND ERROR AMPLIFICATION

This patent application is a Continuation-In-Part of application Ser. No. 08/369,546, filed Jan 6, 1995, now U.S. Pat. No. 5,528,196.

BACKGROUND OF THE INVENTION

This invention relates generally to radio frequency (RF) amplifiers, and more particularly the invention relates to an RF amplifier having improved linearity and reduced intermodulation distortion.

RF amplifiers that operate outside of the small signal range are inherently nonlinear and thus introduce signal distortion when multiple signals are amplified. Recent requirements in cellular telephone technology have mandated increased capacity which in turn requires broad bandwidth, high dynamic range linear amplifiers where the output spectrum is free of unwanted intermodulation products. Intermodulation distortion within the RF amplifier pass-band can severely impede proper transmission and reception of cellular signals.

The concept of feed forward amplification to reduce distortion is known and has been successfully applied to RF amplifiers in the past. However, the prior art amplifiers have a number of limitations. U.S. Pat. No. 5,157,346 discloses a feed forward amplifier in which an error signal is introduced in a feed forward arrangement to minimize distortion. The ability of this system to detect phase over appreciable dynamic range is limited by the chosen configuration of RF mixers. Reasonable dynamic range can be obtained only when the local oscillator (LO) port of a mixer is driven to saturation. Theory and practice show that the dynamic range of a mixer not operating at saturation is limited to around 6 db. Such a mixer does, in normal operation with a saturated LO, generate intermodulation products of its own. Therefore, obtaining appreciable dynamic range and saturation simultaneously in a mixer is mutually exclusive. In the '346 patent, the power at the mixer LO port is directly proportional to the RF input power. Thus, as the RF drive level changes, mixer LO drive changes proportionally. If the LO drive drops more than 6 dB below the optimal LO drive level, the mixer ceases to operate properly.

Further, the '346 amplifier does not compensate for changes in the gain or phase of the error amplifier or the delay line associated therewith. The amplitude and phase adjustments just prior to the error amplifier are preset and an open loop configuration cannot accommodate changes in error amplification parameters due to drive level, temperature, frequency, or ageing.

Other feed forward amplifier patents such as U.S. Pat. No. 4,885,551 disclose feed forward linear amplifier controlled circuitry to scan the prescribed frequency range and detect the amplitude and phase of any undesired signal for subsequent cancellation. While the '551 system offers advantages over other prior art, the system is complex and slow in using a microprocessor and a complex code. Decision-making flow charts require a complex optimization algorithm in software which is slow when compared to well-known and understood closed loop analog implementations.

Copending application Ser. No. 08/369,546 filed Jan. 6, 1995, now U.S. Pat. No. 5,528,196 discloses a feed forward RF amplifier having a high dynamic range and low intermodulation distortion through use of closed loop control circuitry. Two control loops are employed with a main amplifier and an error amplifier. The present invention is a similar RF amplifier but employs a main amplifier for amplifying both the main signal and the error signal.

SUMMARY OF THE INVENTION

In accordance with the present invention, two control loops are employed with two identical high power amplifiers in a quadrature combined configuration which cooperatively function as a main signal amplifier and an error signal amplifier.

An RF input signal is applied through first amplitude and phase trimmers to a first input of the pair of amplifiers, and the amplified RF signal is passed through a first quadrature output of the amplifier pair and through a delay element to the amplifier output. A first control loop including a summer and differential phase-amplitude comparator receives a delayed portion of the RF input signal and a portion of the amplifier output signal and produces control signals for the first amplitude and phase trimmers and an error signal from the combination of the RF input and the amplifier output.

The error signal is applied through second amplitude and phase trimmers to the second input of the pair of amplifiers. The amplified error signal is then coupled to the amplifier output to cancel intermodulation distortion.

A second control loop injects a reference signal to the first input of the main amplifier. This amplified reference signal is then compared to the reference signal at the second output of the main amplifier to generate control signals for second amplitude and phase trimmers in the error path.

The invention and objects and features thereof will be more readily apparent from the following detailed description and appended claims when taken with the drawing.

BRIEF DESCRIPTION OF THE DRAWINGS

FIG. 1 is a schematic of an RF amplifier with notation of the intermodulation distortion resulting from amplification.

FIG. 2 is a functional block diagram of a linear RF amplifier having control loops and a feed forward error signal in accordance with copending application Ser. No. 08/369,546, supra.

DETAILED DESCRIPTION OF ILLUSTRATIVE EMBODIMENTS

Figure 3:
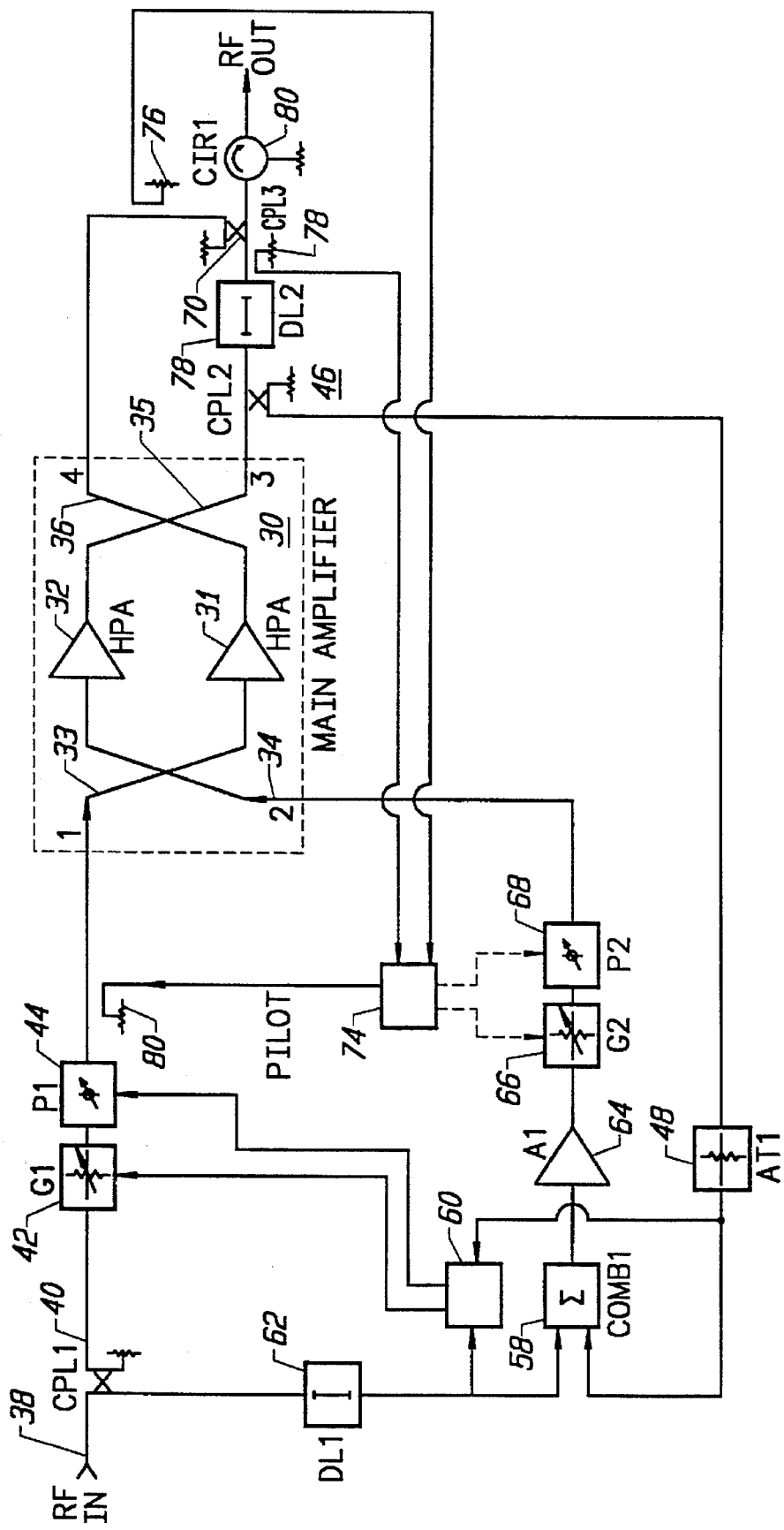
FIG. 3 is a functional block diagram of a linear RF amplifier in accordance with the present invention.

FIG. 1 illustrates an RF amplifier 1 which receives an input signal 2, the frequency spectrum of which may contain several discrete frequencies or tones. Distortion arises due to the inherent nonlinearity of the main RF amplifier 1 and intermodulation of the plurality of input tones resulting in spurious tones at the sum and difference of the input frequencies and their harmonics. As noted above, the intermodulation distortion with the RF amplifier pass-band can severely impede proper transmission and reception of cellular telephone signals.

FIG. 2 is a functional block diagram of a linear RF amplifier having reduced intermodulation distortion in accordance with copending application Ser. No. 08/369,546, supra. Two control loops are provided for increasing linearity of the amplified input signals and for reducing intermodulation distortion, respectively. The RF signal 2 is applied through an amplitude trimmer 4 and a phase trimmer 5 to the main amplifier 1 with the amplified output passed through a delay 15 to the output at 27. A first control loop controls amplitude trimmer 4 and phase trimmer 5 to obtain the correct amplitude and phase of the amplified signals for cancellation. A portion of the input 2 is passed through directional coupler 3 through a delay 6 to an input of a summer 8 and to differential phase-amplitude comparator unit 7. A portion of the output RF signal from amplifier 1 is passed through directional coupler 27 to the differential phase-amplitude comparator 7 and the another input of the summer 8. Control unit 7 compares the delayed RF input and the amplified output and adjusts the amplitude trimmer 4 and phase trimmer 5 so that the two compared signals have equal amplitude and 180° phase relationship. The intermodulation products of the amplified signal appear at the output of the summer 8.

When so controlled the summer 8 effectively subtracts the RF input signal from the amplified output signal, thereby leaving only the intermodulation components, such as the sum and difference of the RF input signal frequencies and their harmonics. The intermodulation components are fed forward through amplitude trimmer 9 and phase trimmer 11, through error amplifier 10 to directional coupler 13 for reintroduction to the amplified signal from amplifier 1 and delay unit 15 to cancel the intermodulation components. Error amplifier 10 is approximately one-tenth the size of the main amplifier 1.

The amplitude trimmer 9 and phase trimmer 11 are controlled to obtain the proper phase and amplitude of the intermodulation components for cancellation at directional coupler 13. To accomplish this, a reference signal from reference generator 72 is introduced to the input of amplifier 1 by directional coupler 20, and a portion of the amplified reference signal is sampled by directional coupler 14 and applied to the loop 2 amplitude and phase controller 73. A portion of the amplified reference signal from amplifier 10 are passed through directional coupler 12 to the loop 2 amplitude and phase controller 73 for comparison with the amplified reference signal sampled by coupler 14. The loop 2 amplitude and phase controller 73 controls the amplitude trimmer 9 and the phase trimmer 11 so that the amplified reference signal, and amplified intermodulation components, from amplifier 10 when added back through coupler 13 will essentially cancel out the amplified reference signal, and intermodulation components, from amplifier 1.

Accordingly, the first control loop concentrates the intermodulation products generated due to the nonlinearity of the amplifier 1, and the second control loop including the loop 2 amplitude and phase controller reinserts feed forward intermodulation components from summer 8 into coupler 13 so that the intermodulation components generated by the main amplifier are cancelled.

FIG. 3 is a schematic of a feed forward RF amplifier in accordance with the present invention in which a separate error amplifier is not required. The RF input signal and the error signal are both amplified in a main amplifier 30 which typically comprises two identical high power amplifiers 31, 32 having inputs 33, 34 and outputs 35, 36 in a quadrature combined configuration. The RF input signal at 38 is passed through a first directional coupler 40 through a first amplitude trimmer 42 and phase trimmer 44 to a first input 33 of the main amplifier 30. Due to the quadrature arrangement, the input signal at 33 passes through amplifiers 31 and 32 to the first output port 35 of the main amplifier. Ideally, the signal at port 35 will not appear at port 36, but in practice, the power level of the signal at port 36 is about 20–25 dB below the power level of the signal at port 35. Further, the signal at port 35 has intermodulation distortions and noise generated by the first amplitude and phase trimmers 42, 44 and the main amplifier 30.

A portion of the distorted output signal at port 35 is sampled by coupler 46 and passed through an attenuator 48 as one input to a combiner 58 and first loop phase and amplitude controller 60. A second input to the combiner 58 is a delayed sample of the undistorted input signal at 38, which is passed through the delay element 62 to the combiner 58. Controller 60 then controls amplitude trimmer 42 and phase trimmer 44 so that the RF signal inputs to combiner 58 and controller 60 will cancel.

At the output of the combiner 58, the carriers of the distorted signal are cancelled, leaving the distortion and noise generated in the main path. This distortion is amplified by low noise amplifier 64 before being amplitude and phase adjusted by a second amplitude trimmer 66 and phase trimmer 68. The error signal output from the phase shifter 68 is amplified by the main amplifier 30 from second input port 34 to second output port 36. This amplified error signal is injected into the main output path by coupler 70 so that the error signal cancels the distortion and noise created in the main path. Circulator 80 connects the amplifier to the RF output and blocks reflected power back into the amplifier.

To maintain this error cancellation over temperature, the second amplitude and phase adjusters 66, 68 are controlled by a second loop phase and amplitude controller 74. Controller 74 receives a first input from the amplified error output at port 36 through coupler 76, and a second input is obtained by a coupler 78 of the amplified main RF signal from port 35 after being passed through a delay element 78. Phase and amplitude controller 74 also provides the pilot or reference signal through coupler 80 to the input port 33 along with the RF input signal. The phase and amplitude controller 74 includes filters so that the input signals thereto are limited to the pilot or reference frequency. Controller 74 controls trimmers 66, 68 to cancel the reference inputs and thus cancel the intermodulation components.

The circuit of FIG. 3 has been fabricated with a main amplifier stage of 300 W peak envelope power (PEP) class AB BJT module with a nominal gain of +18 dB. The intermodulation distortions of the amplifier are better than 30 dBc; the phase linearity is less than ±0.5 degree; and gain flatness is less than ±0.1 dB from 860 to 900 Mhz. The isolation between the two output ports is better than 20 dB. The intermodulation distortion performance for this circuit is summarized in the following table.

TABLE

| FREQ (MHz) | | | 3-TONE IMD (dBc) | | | | | | 14-TONE IMD (dBc) | | |
| --- | --- | --- | --- | --- | --- | --- | --- | --- | --- | --- | --- |
| | | | Pout = 38 dBm/tone | | Pout = 32 dBm/tone | | Pout = 28 dBm/tone | | | | |
| | | | 860–900 | | 860–900 | | 860–900 | | Pout/tone | 860–900 | Out of |
| F1 | F2 | F3 | MHz | Out of Band | MHz | Out of Band | MHz | Out of Band | (dBm) | MHz | Band |
| 869 | 869.09 | 894 | −50 | −42 | −55 | −41 | −60 | −41 | 35 | −41 | −41 |
| 869 | 893.9 | 894 | −46 | −45 | −52 | −41 | −54 | −42 | 32 | −49 | −46 |
| 869 | 874 | 894 | −51 | −47 | −52 | −45 | −53 | −44 | 30 | −46 | −47 |
| 869 | 879 | 894 | −50 | −49 | −52 | −48 | −55 | −47 | 27 | −49 | −49 |
| 869 | 884 | 894 | −47 | −51 | −51 | −4 | −50 | −48 | 22 | −49 | −53 |
| 869 | 889 | 894 | −48 | −48 | −50 | −43 | −53 | −45 | | | |

CARIER FREQ = 869 + 1.666 n
where n = 1, 2 ... 15, n = 8
Out of Band = 820–860 MHz and 900–920 MHz For average output power up to 30 watts, typical intermodulation distortion is better than −45 dBc within frequency range of 860–900 MHz. With the feed forward correction disabled, typical intermodulation distortion of the system is −25 dBc at 30 watts average output power.

The described feed forward amplifier functions with two control loops and with the main amplifier functioning as the main amplifier and the error amplifier. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A radio frequency (RF) amplifier having improved linearity and reduced intermodulation distortion comprising an input terminal for receiving RF signals to be amplified, a main amplifier including two high power amplifiers having first and second input ports and first and second output ports in a quadrature combined configuration, a first amplitude and phase trimmer, means for connecting said input terminal through said first amplitude and phase trimmer to said first input port, a combiner and a first controller for receiving and comparing a delayed portion of an input signal at said input terminal and a portion of an amplified input signal at said first output port, said first controller controlling said first amplitude and phase trimmer so that said input signal and said amplified output signal have the same amplitude and are 180 degrees out of phase relative to each other, said combiner generating an error signal by combining said input signal and said amplified input signal, means including a second amplitude and phase trimmer for applying said error signal to said second input port, means for coupling an amplified error signal at said second output port to a delayed amplified input signal from said first output port, and a second controller for generating a pilot signal for introduction at said first input port and for receiving and comparing a delayed portion of said pilot signal at said first output port and a portion of an amplified error signal at said second output port and controlling said second amplitude and phase trimmer.

2. The RF amplifier as defined by claim 1 wherein said means for connecting said input terminal through said first amplitude and phase trimmer includes a first coupler.

3. The RF amplifier as defined by claim 2 and further including a second coupler for coupling said pilot signal to said first input of said main amplifier.

4. The RF amplifier as defined by claim 3 and including a third coupler for coupling said portion of said amplified input signal to said first controller.

5. The RF amplifier as defined by claim 4 and further including a circulator for applying said amplified error signal coupled with said delayed amplified input signal to an RF amplifier output terminal.

6. The RF amplifier as defined by claim 1 and further including a circulator for applying said amplified error signal coupled with said delayed amplified input signal to an RF amplifier output terminal.

* * * * *